(12) United States Patent
Ohta (10) Patent No.: US 6,614,841 B1
(45) Date of Patent: Sep. 2, 2003

(54) SIGNAL PROCESSING APPARATUS (75) Inventor: Haruo Ohta, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/533,777

(22) Filed: Mar. 24, 2000

(30) Foreign Application Priority Data

Mar. 26, 1999 (JP) ............................................ 11/083321

(51) Int. Cl.$^7$ ................................................ H03H 7/40
(52) U.S. Cl. ........................ 375/232; 375/327; 375/355; 375/375; 375/376; 329/307; 329/325; 329/360; 327/156
(58) Field of Search ................................ 375/229, 230, 375/232, 324–327, 354, 355, 371, 373, 376, 375; 455/182.1, 182.2, 183.1, 192.1, 192.2; 329/307, 325, 360; 327/141, 147, 155, 156, 163

(56) References Cited

U.S. PATENT DOCUMENTS

| | | | |
|---|---|---|---|
| 5,537,419 A | * | 7/1996 | Parr et al. .................... 370/350 |
| 5,999,355 A | * | 12/1999 | Behrens et al. ................ 360/65 |
| 6,028,902 A | * | 2/2000 | Kiyanagi et al. ............ 375/355 |
| 6,201,832 B1 | * | 3/2001 | Choi .......................... 375/233 |

OTHER PUBLICATIONS

"A PRML System for Digital Magnetic Recording", IEEE Journal on selected areas in Communications, vol. 10, No. 1, pp. 38–56 (Jan. 1992).

"Implementation of PRML in a Rigid Disk Drive", IEEE Transactions on Magnetics, vol., 27, No. 6, pp 4538–4543 (Nov. 1991).

* cited by examiner

Primary Examiner—Stephen Chin
Assistant Examiner—Dac V. Ha
(74) Attorney, Agent, or Firm—Wenderoth, Lind & Ponack, L.L.P.

(57) ABSTRACT

A reproduced signal is adaptively equalized in an adaptive equalizer after going through an AD converter. The AD converter, the adaptive equalizer, a phase error detector, a phase shifter, a DA converter, a loop filter, and a variable frequency oscillation circuit, all of which structure a PLL circuit, and a clock signal phase-locked to reproduced data is fed back to the AD converter. The phase shifter slightly shifts, as appropriate, a phase error detected in the phase detector according to the change in a barycenter of tap coefficients detected in a tap barycenter detection circuit. With such structure, signals can be processed in an accurate manner without causing competition in operation between the PLL and adaptive equalization.

6 Claims, 11 Drawing Sheets

SIGNAL PROCESSING APPARATUS

BACKGROUND OF THE INVENTION

1. Field of the Invention

The present invention relates to signal processing apparatuses, and more particularly to a signal processing apparatus in which a received signal or a signal reproduced from a recording medium is subjected to both adaptive equalization and sampling.

2. Description of the Background Art

In hard disk drives and magnetic tape drives where digital data is recorded/reproduced, a PRML (Partial Response Maximum Likelihood) method has been recently applied to detect data. In this method, a reproduced signal is first subjected to partial response equalization and then to maximum likelihood decoding by going through a Viterbi decoder, for example. For data detection under this PRML method, the drive needs to have two functions: a waveform equalization function of accurately subjecting a reproduced signal to partial response equalization; and a function of generating a clock signal which is accurately synchronized with reproduced data for sampling. A description is given next below about a reproduced signal processing part of a conventional hard disk drive applying the PRML method therein.

Figure 8:
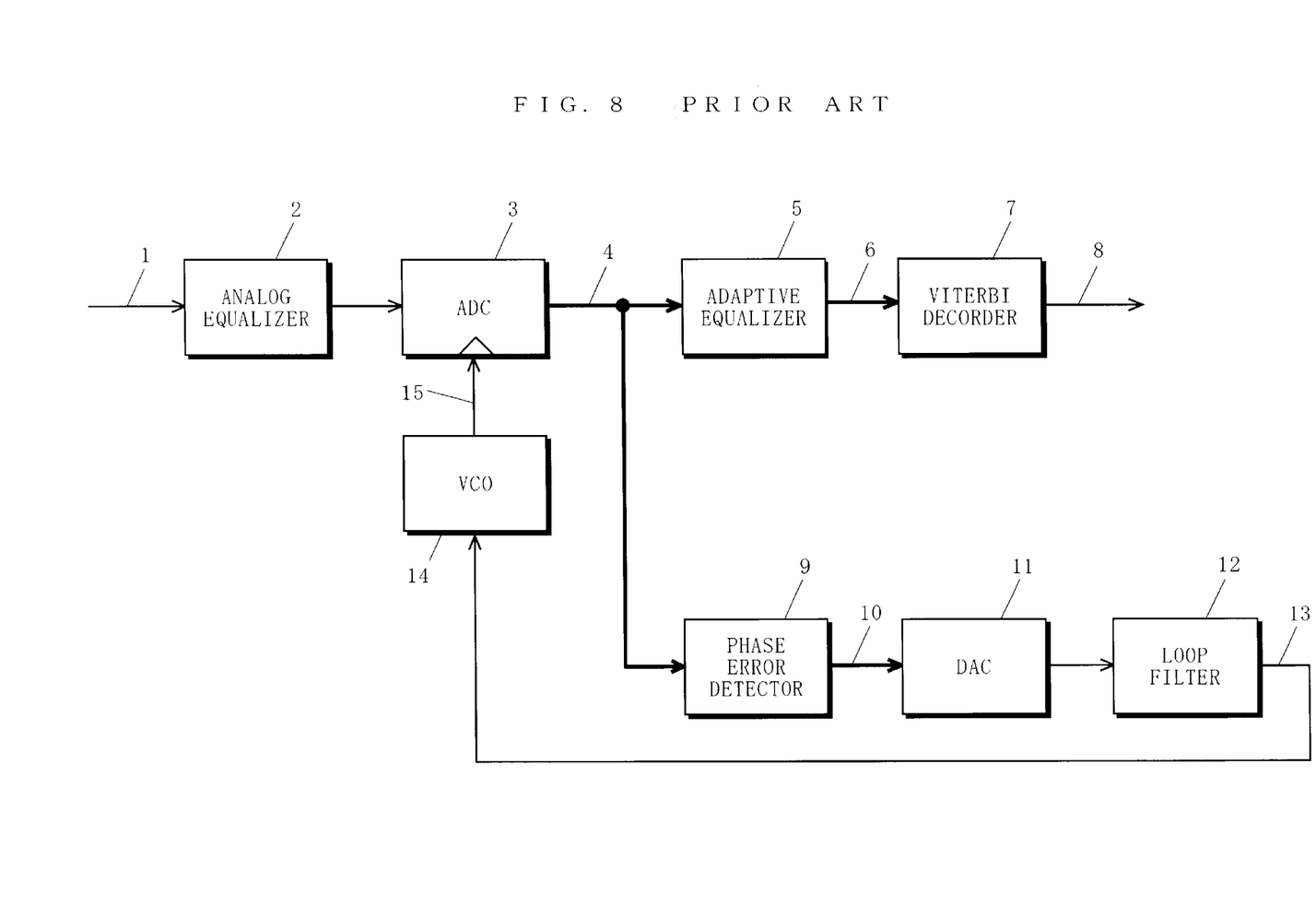
FIG. 8 is a block diagram showing the structure of a conventional signal processing apparatus.

FIG. 8 is a block diagram showing the structure of a conventional signal processing apparatus used as the reproduced signal processing part of the hard disk drive. In FIG. 8, a reproduced signal 1 reproduced from a magnetic recording medium is subjected to partial response equalization in an analog equalizer 2. The equalized signal is subjected to sampling and digitalization in an AD converter (ADC) 3 with timing of a clock signal 15, and then is outputted as a sampled signal 4. The sampled signal 4 is provided to both an adaptive equalizer 5 and a phase error detector 9. The adaptive equalizer 5 adaptively corrects the sampled signal 4, depending on a state of the signal, in such a manner as to minimize a deviation from an ideal signal value caused by time-varying change in characteristics of the recording medium or reproduction head, for example, and then outputs an equalized signal 6. A Viterbi decoder 7 subjects, in consideration of partial response signal correlation, the equalized signal 6 to most likelihood decoding according to Viterbi algorithm, and then detects digital information previously recorded on the recording medium for output as reproduced data 8.

The phase error detector 9 detects, according to the sampled signal 4, any deviation of the sample point thereof from an ideal sample point (hereinafter, referred to as phase error). The phase error is resulted from the timing of sampling carried out in the AD converter 3, and the phase error detector 9 outputs a phase error signal 10. Note that, an exemplary structure of the phase error detector 9 is found in Roy. D. Cideciyan, et al., "A PRML System for Digital Magnetic Recording", IEEE Journal on selected areas in Communications, Vol. 10, No. 1, pp. 38-pp. 56 (January. 1992). The phase error signal 10 is converted into an analog signal in a DA converter (DAC) 11, and the analog signal is subjected to smoothing in a loop filter 12 to be an oscillation frequency control signal 13. A variable frequency oscillation circuit 14 oscillates in a frequency corresponding to a voltage of the oscillation frequency control signal 13,.and outputs the clock signal 15. The clock signal 15 is fed back as a clock for sampling in the AD converter 3. Since all of the AD converter 3, the phase error detector 9, the DA converter 11, the loop filter 12, and the variable frequency oscillation circuit 14 structure a PLL (Phase Locked Loop) circuit, the clock signal 15 can be a clock phase-locked to the reproduced data.

With such structure and operation, the conventional signal processing apparatus in FIG. 8 implements data reproduction under the PRML method.

Reproduced signal processing under such PRML method is found in, for example, J. D. Cocker, et al., "Implementation of PRML in a rigid disk drive", IEEE Transactions on Magnetics, Vol. 27, No. 6 (November 1991).

As described in the foregoing, the conventional signal processing apparatus in FIG. 8 so generates the clock signal 15 as to minimize the phase error of the sample point of the sampled signal 4. From a viewpoint of implementing data reproduction with a lower error rate under the PRML method, it is preferable to so generate the clock signal 15 as to minimize the phase error of a sample point of the equalized signal 6. In this manner, the clock signal 15 can be more-accurately phase-locked to reproduced data.

Further, in the conventional signal processing apparatus in FIG. 8, the analog equalizer 2 is the one which mainly carries out the partial response equalization. However, from viewpoints of improving the degree of accuracy in equalization and simplifying the process of LSI, it is more preferable to carry out the equalization in digital processing.

Figure 9:
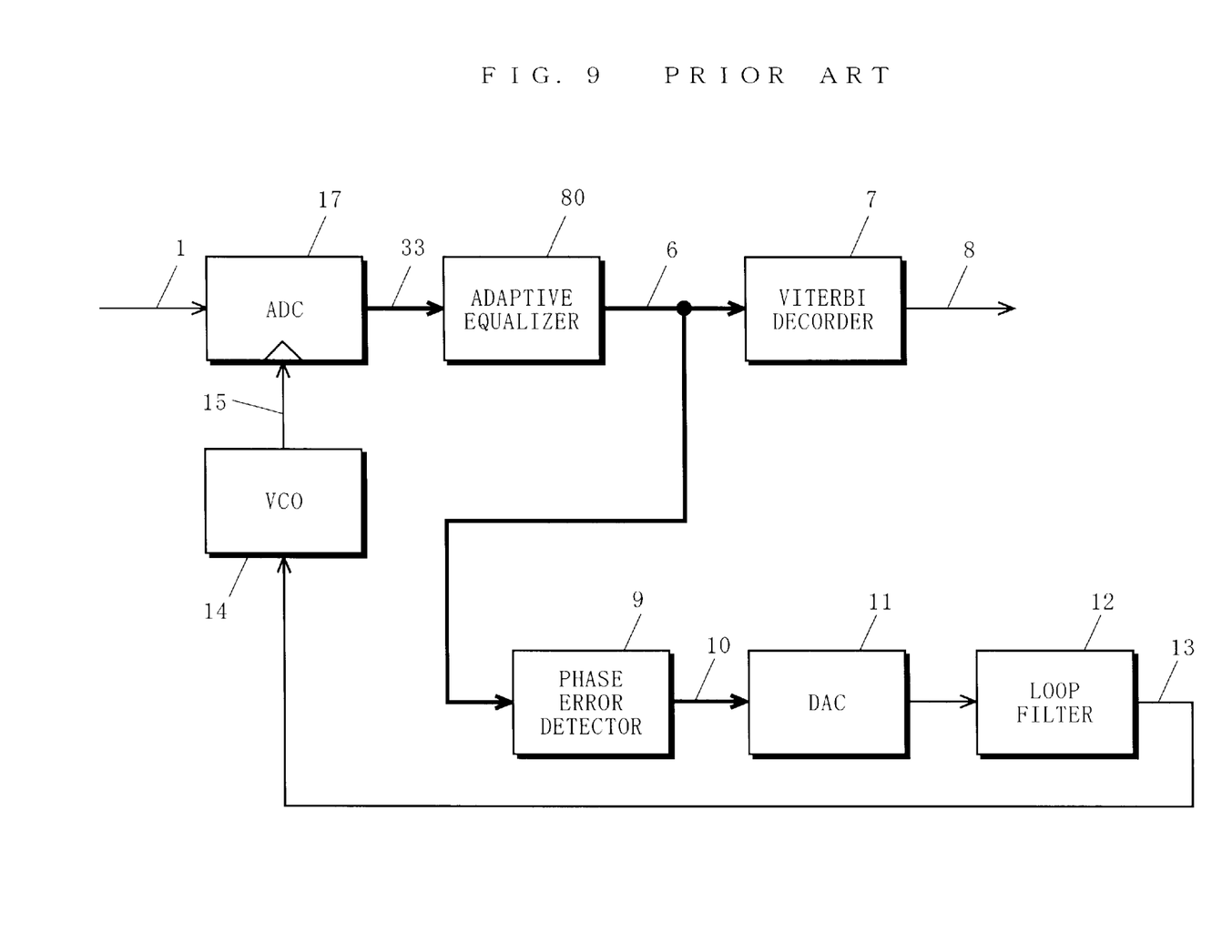
FIG. 9 is a block diagram showing the structure of a signal processing apparatus as an exemplary betterment for the conventional signal processing apparatus in FIG. 8.

With such viewpoints, the signal processing apparatus may be structured as shown in FIG. 9.

FIG. 9 is a block diagram showing the structure of the signal processing apparatus as an exemplary betterment for the conventional one in FIG. 8. In FIG. 9, any constituent found in FIG. 8 is denoted by the same reference numeral. Differences between these two signal processing apparatuses lie in three respects: the reproduced signal 1 skips the analog equalizer 2 and goes straight to an AD converter 17; an adaptive equalizer 80 subjects a sampled signal 33 to partial response equalization and also to adaptive equalization in such a manner as to minimize the equalization error; and a signal forwarded to the phase error detector 9 is the equalized signal 6. Such structure realizes data reproduction under the PRML method at a lower error rate, improvement in equalization accuracy, and a simplified LSI.

In the signal processing apparatus in FIG. 9, however, some competitive problem may be caused by two types of feed back control including adaptive equalization and PLL. Such new problem is described next below by referring to FIGS. 10 and 11.

Figure 10:
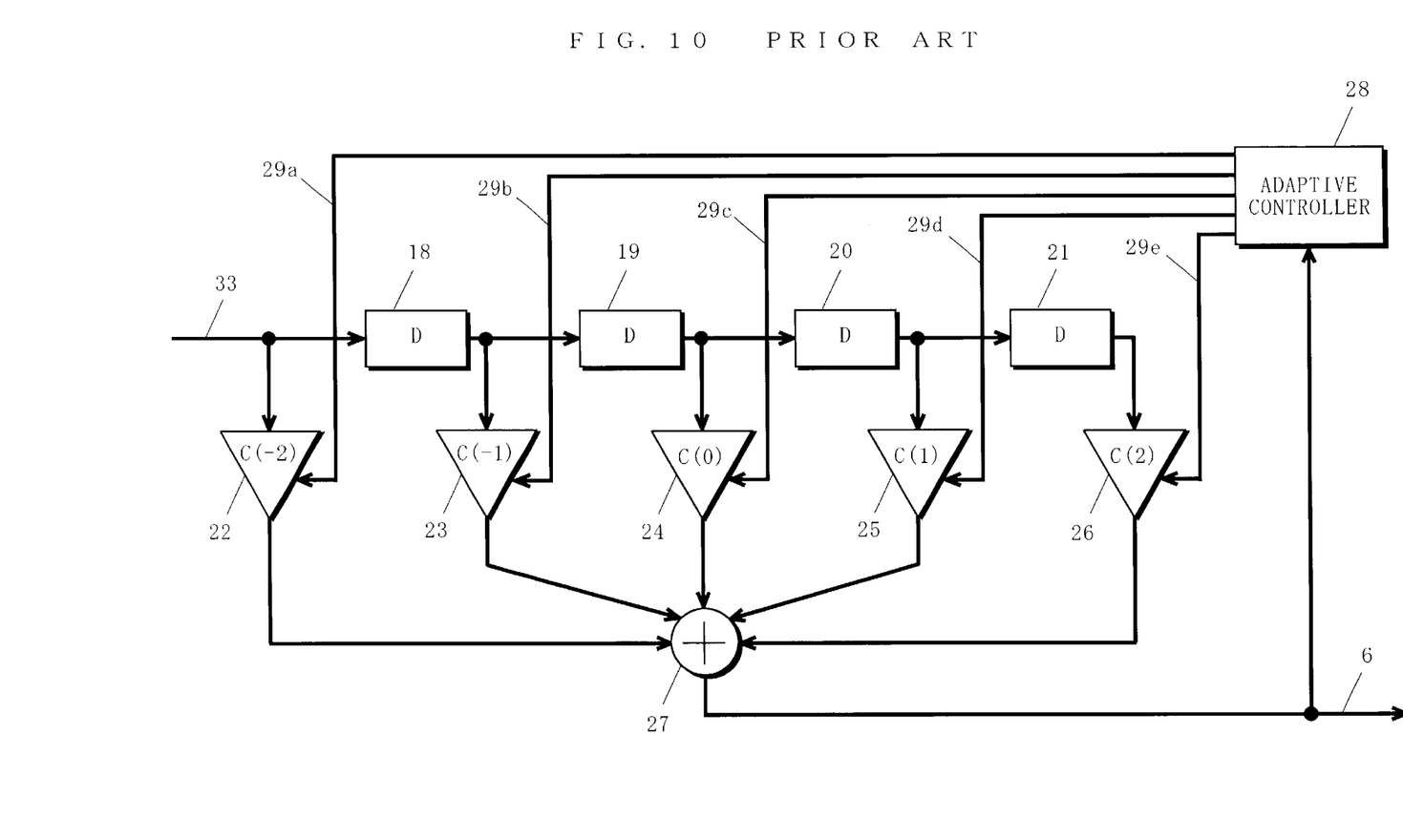
FIG. 10 is a block diagram showing the structure of an adaptive equalizer in the signal processing apparatus in FIG. 9.

FIG. 10 is a block diagram showing the structure of the adaptive equalizer 80 of the signal processing apparatus in FIG. 9. As shown in FIG. 10, the adaptive equalizer 80 is structured by a transversal-type filter with 5 taps and an adaptive controller 28. The sampled signal 33 is sequentially delayed by going through delay circuits 18 to 21, which each delays the signal on a data period basis. A coefficient circuit 22 multiplies the sampled signal 33 by a coefficient C(−2) and other coefficient circuits 23 to 26 multiply outputs from the delay circuits 18 to 21, respectively, by coefficients C(−1), C(0), C(1), and C(2) for output. An adding circuit 27 adds every output from the coefficient circuits 22 to 26, and then outputs the sum as the equalized signal 6. According to the equalized signal 6, the adaptive controller 28 adaptively controls every coefficient by tap coefficient signals 29a to 29e in such a manner as to minimize a mean-square error of the signal amplitude of the equalized signal 6. Such adaptive control is well known as an LMS (Least Means Square) algorithm, and is not described in detail.

The equalized signal 6 generated in the adaptive equalizer 80 is provided both to the Viterbi decoder 7 and the phase error detector 9. The phase error detector 9 detects any phase error of the sample point of the equalized signal 6, and then generates the phase error signal 10. From then onward, the clock signal 15 is generated according to the phase error signal 10 in a similar manner to the signal processing apparatus in FIG. 8, and is fed back to the AD converter 17 as a clock for sampling.

Figure 11:
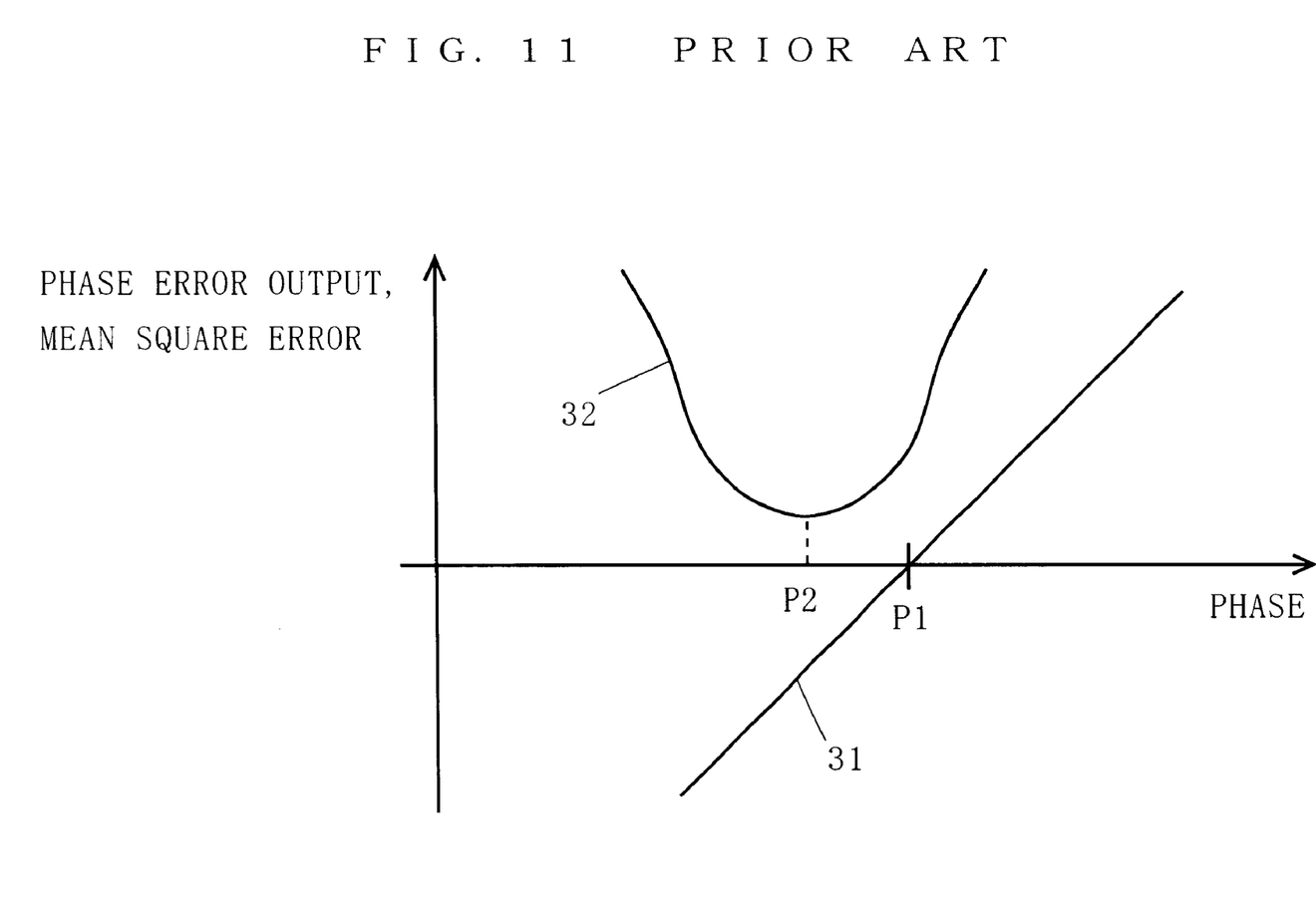
FIG. 11 is a characteristic graph illustrating how the signal processing apparatus in FIG. 9 is operated.

By referring to FIG. 11, it is described how the phase of the sample point of the equalized signal 6 is shifted by such operation. In FIG. 11, a linear line 31 shows the relationship between the phase of the sample point of the equalized signal 6 and the phase error indicated by the phase error signal 10 generated in the phase error detector 9. Herein, when the phase error indicated by the phase error signal 10 is 0, the phase of the equalized signal 6 is equal to a phase P1. Through the operation of the PLL, the phase of the sample point of the equalized signal 6 is controlled to be P1. A curve 32 shows the relationship between the phase of the sample point of the equalized signal 6 and the mean-square error of the signal amplitude of the equalized signal 6. The mean-square error is an evaluation function of tap control in the adaptive equalizer 80, and each tap coefficient therein is so controlled as to minimize the mean-square error. Herein, when the mean-square error is minimum, the phase of the equalized signal 6 is equal to a phase P2. Through the adaptive equalization carried out in the adaptive equalizer 80, the phase of the sample point of the equalized signal 6 is controlled to be P2. Note herein that, the phases P1 and P2 coincide with each other under ideal conditions. In reality, however, the coincidence is not achieved but a slight difference is observed therebetween. This is because, some distortion or noise is observed in the equalized signal 6, and a phase error detection characteristic of the phase error detector 9 is not necessarily ideal.

In the state shown in FIG. 11, it is assumed that the phase of the sample point of the equalized signal 6 is on the phase P1. If this is the case, the adaptive equalizer 80 controls the tap coefficients in such a manner as to minimize the mean-square error of the equalized signal 6, that is, as to bring the phase of the sample point thereof closer to the phase P2. In detail, in the adaptive equalizer 80 in FIG. 10, the coefficients $C(-1)$ and $C(-2)$ of the coefficient circuits 23 and 22 are more weighted (i.e., absolute value increased), while the coefficients $C(1)$ and $C(2)$ of the coefficient circuits 25 and 26 are less weighted. As a result, the phase of the sample point of the equalized signal 6 slightly moves from P1 to the direction of P2.

Consequently, the phase of the sample point of the equalized signal 6 is displaced from P1, and accordingly the value of the phase error signal 10 detected in the phase error detector 9 is not 0 any more. Therefore, by the operation of the PLL, oscillation phase of the clock signal 15 is so controlled as to bring the phase of the sample point of the equalized signal 6 back to P1 again.

Thereafter, the adaptive equalizer 80 again so controls the tap coefficients as to bring the phase of the sample point of the equalized signal 6 closer to P2, and consequently the tap coefficients $C(-1)$ and $C(-2)$ are weighted still more, while the tap coefficients $C(1)$ and $C(2)$ are weighted still less. The phase of the sample point of the equalized signal 6 thus slightly moves from P1 to the direction of P2 again.

If such operation is repeated, a center of weight of the tap coefficients in the adaptive equalizer 80 keeps moving from the coefficient $C(0)$ of the coefficient circuit 24 to the coefficient $C(-1)$ of the coefficient circuit 23 and the coefficient $C(-2)$ of the coefficient circuit 22. Note that, "center of weight of the tap coefficients" herein means "ideational center of weight" where a plurality of tap coefficients show a well-balance. As a result, the 5-tap adaptive equalizer 80 eventually becomes beyond control and cannot fully carry out the equalization processing any more, thereby rendering the error rate increased.

As is known from the above, if the signal processing part is structured as in FIG. 9 for the purpose of decreasing the error rate, the PLL for generating the clock signal 15 and the adaptive equalizer 80 may compete in operation with each other, and accordingly the adaptive equalizer 80 fails to fully carry out the adaptive equalization processing and the error rate is increased.

SUMMARY OF THE INVENTION

Therefore, an object of the present invention is to provide a signal processing apparatus in which accurate phase lock is implemented by generating a clock signal after any phase error being detected from an adaptively-equalized signal, and also phase-lock processing and adaptive-equalization processing do not compete in operation with each other, thereby preventing an equalization characteristic from being deteriorated.

The present invention has the following features to attain the object above.

A first aspect of the present invention is directed to a signal processing apparatus, comprising:

a sampling part for subjecting an incoming signal to sampling with a given clock signal;

an equalization part for subjecting the signal sampled by the sampling part to product-sum operation according to a plurality of tap coefficients;

an adaptive control part for setting, on the basis of an output signal from the equalization part, a plurality of tap coefficients of said equalization part according to a given algorithm;

a phase error detection part for detecting a phase error from the output signal from the equalization part;

a tap barycenter detection part for detecting, according to the plurality of tap coefficients set by the adaptive control part, a barycenter of the tap coefficients;

a phase shift part for correcting an output from the phase error detection part according to an output from the tap barycenter detection part; and an oscillation part for oscillating in a frequency based on an output signal from the phase shift part, and generating the given clock signal for output to the sampling part.

As described above, in the first aspect, accurate phase-lock is realized by carrying out phase-lock according to an adaptively-equalized signal, deterioration of an equalization characteristic which has been resulted from competition in operation between phase lock processing and adaptive equalization processing is prevented by controlling movement of a barycenter of tap coefficients to be within a given range, and improvement in equalization accuracy and a simplified LSI are achieved by digital equalization processing.

According to a second aspect, in the first aspect, the tap barycenter detection part includes a product-sum operation part for multiplying, by a given value, every absolute value of the tap coefficients set by the adaptive control part, and adding the values.

As described above, in the second aspect, with simple structure and operation, the barycenter of the tap coefficients is easily determined according to a plurality of tap coefficients.

According to a third aspect, in the first aspect, the phase shift part selects any one of correction values predetermined according to the output from the tap barycenter detection part, and correcting the output from the phase error detection part according to the selected correction value.

As described above, in the third aspect, with simple structure and operation, correction can be greatly effective.

A fourth aspect is directed to a signal processing apparatus, comprising:

an equalization part for subjecting an incoming signal to product-sum operation according to a plurality of tap coefficients;

a sampling part for subjecting an output signal from the equalization part to sampling with a given clock signal;

an adaptive control part for setting, on the basis of an output signal from the sampling part, a plurality of tap coefficients of the equalization part according to a given algorithm;

a phase error detection part for detecting a phase error from the output signal from the sampling part;

a tap barycenter detection part for detecting, according to the plurality of tap coefficients set by the adaptive control part, a barycenter of the tap coefficients;

a phase shift part for correcting an output from the phase error detection mean according to an output from the tap barycenter detection part; and an oscillation part for oscillating in a frequency according to an output signal from the phase shift part, and generating the given clock signal for output to the sampling part.

As described above, in the fourth aspect, accurate phase-lock is realized by carrying out phase-lock according to an adaptively-equalized signal, deterioration of an equalization characteristic which has been resulted from competition in operation between phase lock processing and adaptive equalization processing is prevented by controlling movement of a barycenter of tap coefficients to be within a given range, and response in the phase lock process can be made more quickly thanks to shorter delay time in the PLL loop.

According to a fifth aspect, in the fourth aspect, the tap barycenter detection part includes an operation part for multiplying, by a given value, every absolute value of the tap coefficients set by the adaptive control part, and adding the values.

As described above, in the fifth aspect, with simple structure and operation, the barycenter of the tap coefficients is easily determined according to a plurality of tap coefficients.

According to a sixth aspect, in the fourth aspect, wherein the phase shift part selects any one of correction values predetermined according to the output from the tap barycenter detection part, and correcting the output from the phase error detection part according to the selected correction value.

As described above, in the sixth aspect, with simple structure and operation, correction can be greatly effective.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

By referring to FIGS. 1 to 5b, a signal processing apparatus according to a first embodiment of the present invention is described next below. Note herein that, any constituent found in FIGS. 9 to 11 is denoted by the same reference numeral.

Figure 1:
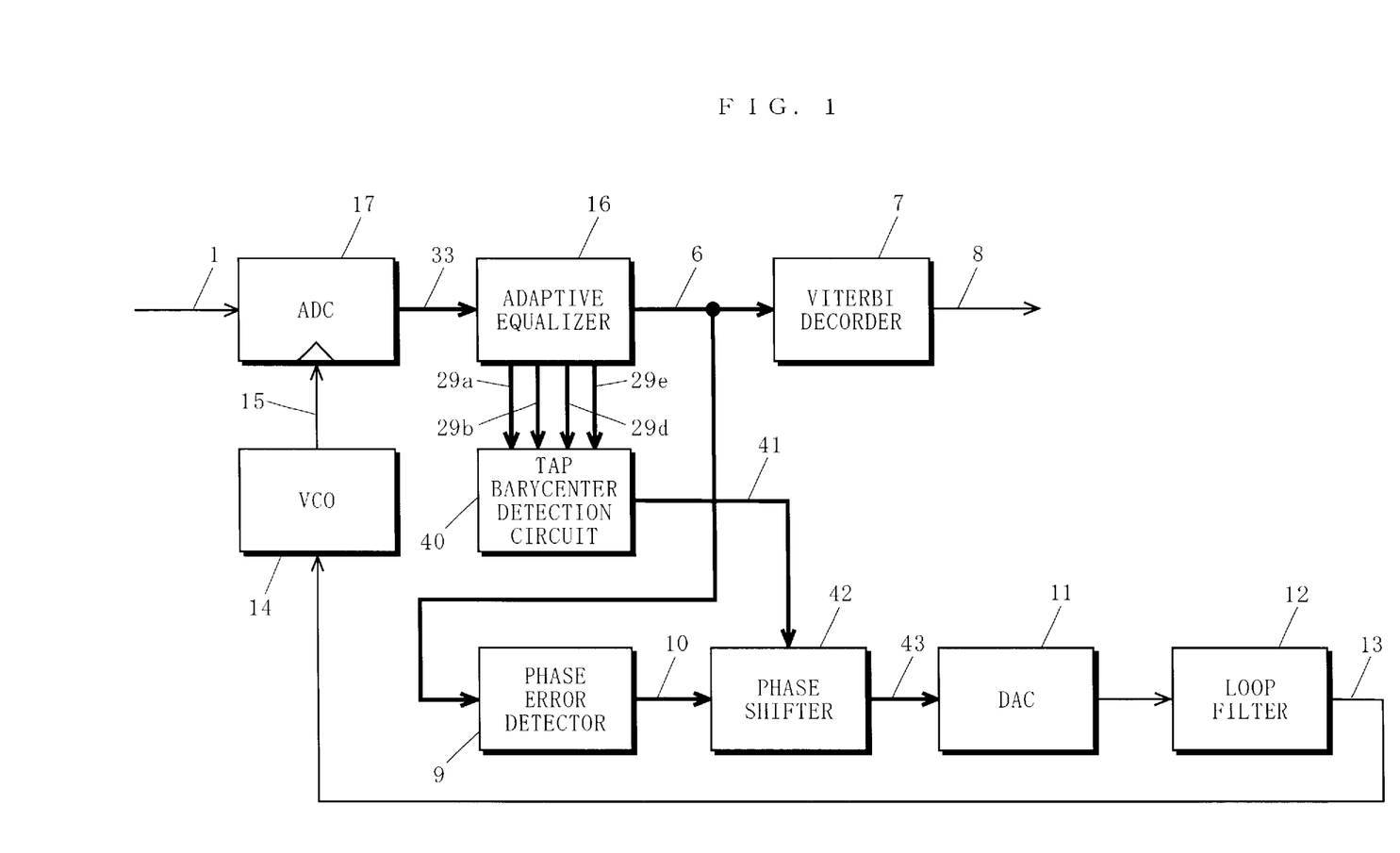
FIG. 1 is a block diagram showing the structure of a signal processing apparatus according to a first embodiment of the present invention.

FIG. 1 is a block diagram showing the structure of the signal processing apparatus of the first embodiment. As shown in FIG. 1, the signal processing apparatus is provided with the AD converter (ADC) 17 as sampling means, an adaptive equalizer 16 as equalization and adaptive control means, the phase error detector 9 as phase error detection means, a tap barycenter detection circuit 40 as tap barycenter detection means, a phase shifter 42 as phase shift means, the DA converter (DAC) 11, the loop filter 12, and the variable frequency oscillation circuit (VCO) 14 as oscillation means.

In FIG. 1, the reproduced signal 1 reproduced from a magnetic recording medium is forwarded to the AD converter 17, and is subjected to sampling and digitalization therein according to the to-be-provided clock signal 15. Thereafter, the signal is provided to the adaptive equalizer 16 as a sampled signal 33. The adaptive equalizer 16 performs equalization in such a manner that impulse response from recording to output from the adaptive equalizer 16 becomes a given partial response characteristic. Further, the adaptive equalizer 16 adaptively subjects the sampled signal 33 to equalization, depending on a state of the signal, in such a manner as to minimize a deviation from an ideal signal value caused by time-varying change in characteristics of the recording medium or reproduction head, for example, and then outputs the equalized signal 6. The equalized signal 6 is provided to both the Viterbi decoder 7 and the phase error detector 9. The Viterbi decoder 7 performs most likelihood decoding according to the Viterbi algorithm, and then detects digital information recorded on the recording medium for output as reproduction data 8.

The phase error detector 9 detects, according to the equalized signal 6, any deviation of the sample point thereof from an ideal sample point (hereinafter, referred to as phase error). This phase error is resulted from the timing of sampling carried out in the AD converter 17, and the phase error detector 9 outputs the phase error signal 10. The phase error signal 10 is provided to the phase shifter 42. The phase shifter 42 shifts the phase error indicated by the phase error signal 10 in accordance with a tap barycenter signal 41 for output as a shift phase error signal 43. The shift phase error signal 43 is converted into an analog signal in the DA converter 11, and the analog signal is subjected to smoothing in the loop filter 12 to be the oscillation frequency control signal 13. The oscillation frequency control signal 13 is provided to the variable frequency oscillation circuit 14. The variable frequency oscillation circuit 14 oscillates in a frequency corresponding to a voltage of the oscillation frequency control signal 13, and outputs the clock signal 15. The clock signal 15 is fed back to the AD converter 17 as a clock for sampling therein. Since a feed back loop including all of the AD converter 17, the adaptive equalizer 16, the phase error detector 9, the phase shifter 42, the DA converter 11, the loop filter 12, and the variable frequency oscillation circuit 14 structures a PLL circuit, the clock signal 15 can be a clock phase-locked to the reproduced data.

Figure 2:
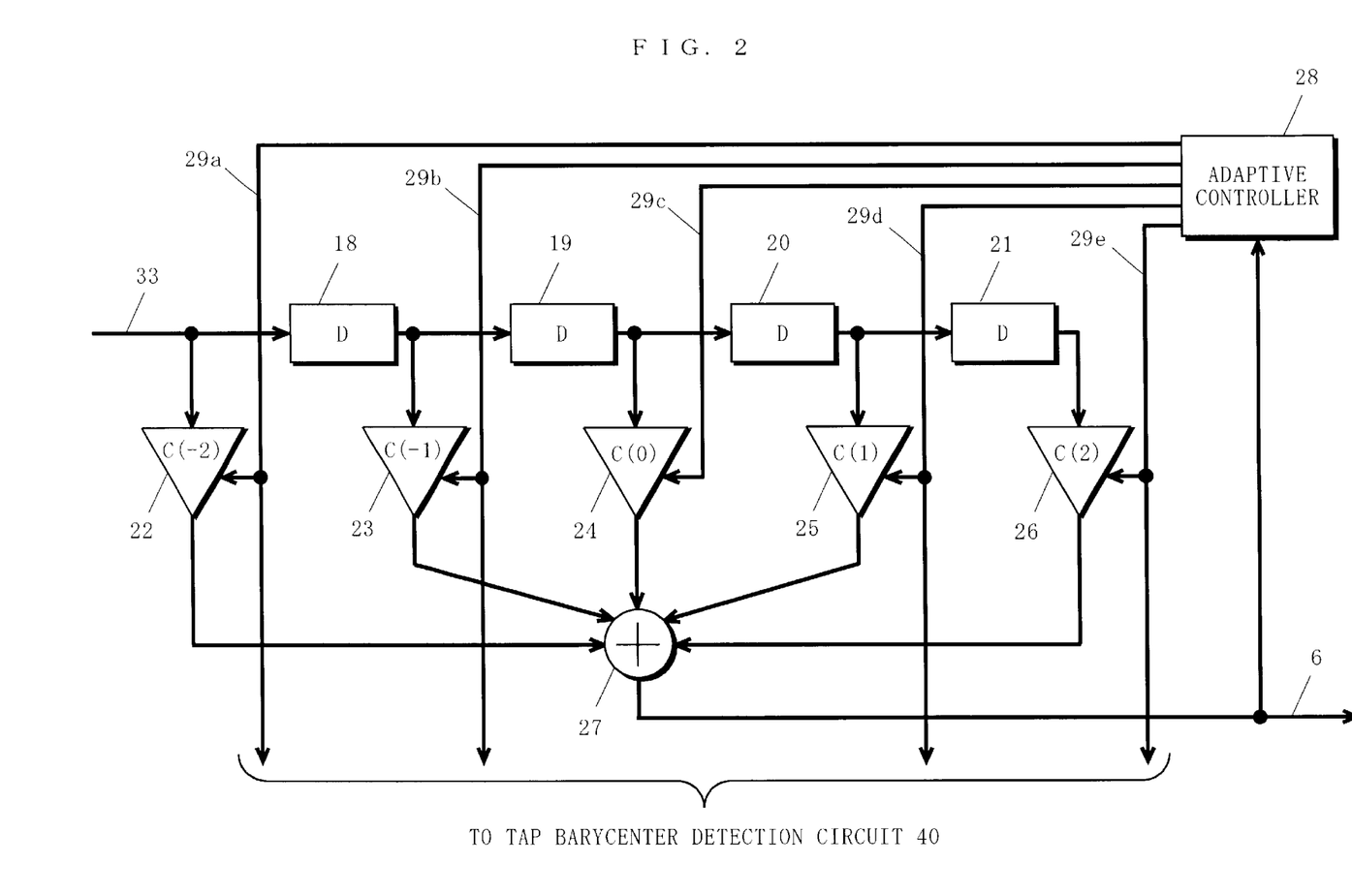
FIG. 2 is a block diagram showing the structure of an adaptive equalizer in the signal processing apparatus of the first embodiment.

FIG. 2 is a block diagram showing the structure of the adaptive equalizer 16 in the signal processing apparatus of the first embodiment. As shown in FIG. 2, the adaptive equalizer 16 is structured by a transversal-type filter with 5 taps and the adaptive controller 28. The sampled signal 33 is sequentially delayed by going through the delay circuits 18 to 21, which each delays the signal on a data period basis. The coefficient circuit 22 multiplies the sampled signal 33 by a coefficient C(-2) for output. The coefficient circuit 23 multiplies an output from the delayed circuit 18 by a coefficient C(-1) for output. Similarly, for output, the coefficient circuit 24 multiplies an output from the delayed circuit 19 by a coefficient C(0), the coefficient circuit 25 multiplies an output from the delayed circuit 20 by a coefficient C(1), and the coefficient circuit 26 multiplies an output from the delayed circuit 21 by a coefficient C(2). The adding circuit 27 adds every output from the coefficient circuits 22 to 26, and outputs the sum as the equalized signal 6. The equalized signal 6 is provided also to the adaptive controller 28. The adaptive controller 28 provides the coefficient circuit 22 with the tap coefficient signal 29a indicating the coefficient C(-2). Similarly, the adaptive controller 28 provides the coefficient circuit 23 with the tap coefficient signal 29b indicating the coefficient C(-1), the coefficient circuit 24 with the tap coefficient signal 29c indicating the coefficient C(0), the coefficient circuit 25 with the tap coefficient signal 29d indicating the coefficient C(1), and the coefficient circuit 26 with the tap coefficient signal 29e indicating the coefficient C(2). At this time, the adaptive controller 28 adaptively controls every coefficient in such a manner as to minimize mean-square error of the signal amplitude of the equalized signal 6. Such adaptive control is well known as an LMS (Least Means Square) algorithm, and is not described in detail. Note that, the coefficient control signals 29a, 29b, 29d and 29e from the adaptive controller 28 are also fed to the tap barycenter detection circuit 40.

Figure 3:
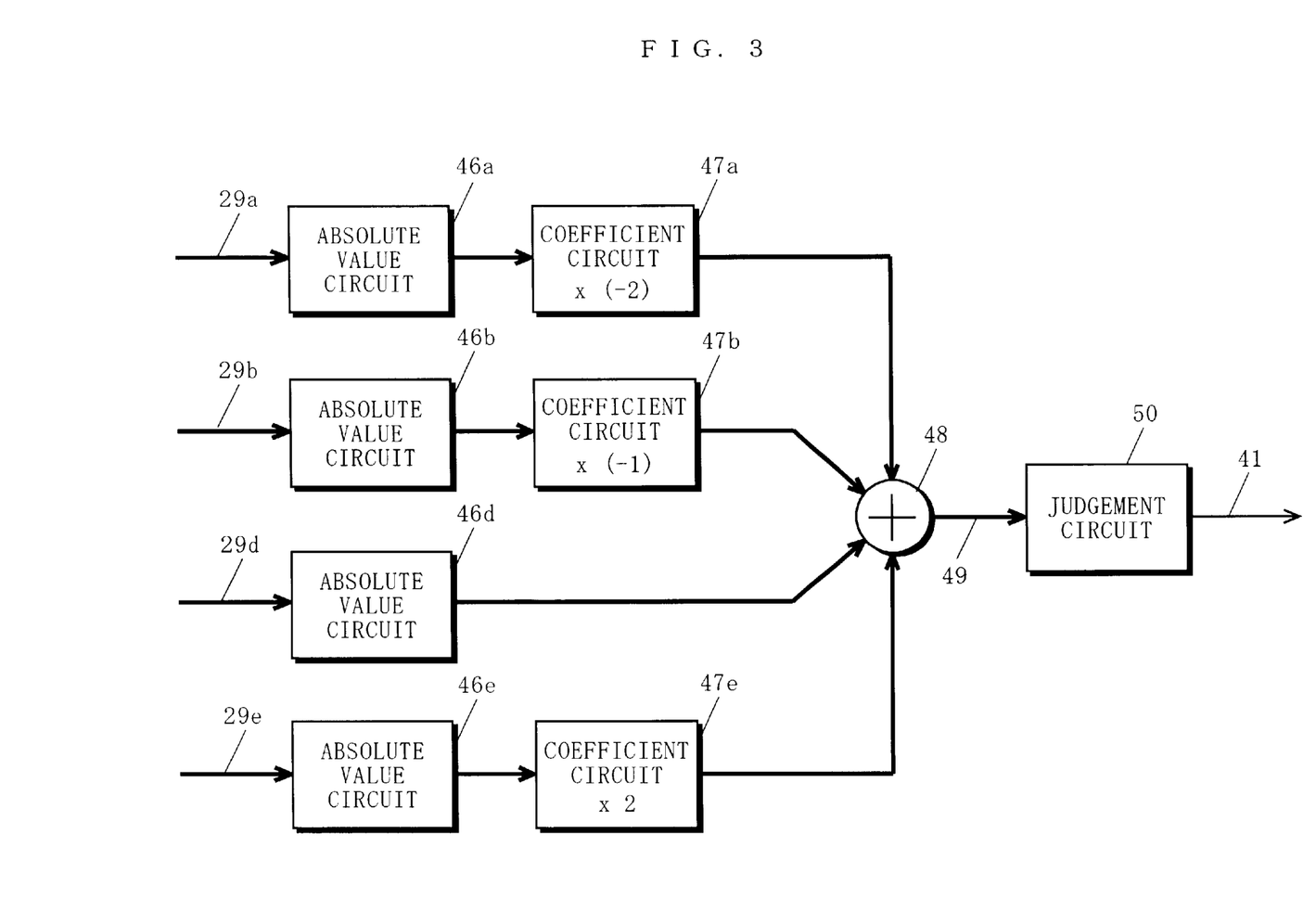
FIG. 3 is a block diagram showing the structure of a tap barycenter detection circuit in the signal processing apparatus of the first embodiment.

FIG. 3 is a block diagram showing the structure of the tap barycenter detection circuit 40 in the signal processing apparatus of the first embodiment. The tap barycenter detection circuit 40 is described next below. Note herein that, "tap barycenter" means "center of weight of tap coefficients", and "center of weight of tap coefficients" means "ideational center of weight" where a plurality of tap coefficients show a well-balance.

As is described in the foregoing, the tap barycenter detection circuit 40 is not provided with the tap coefficient signal 29c which indicates the centric tap coefficient C(0) but other four coefficient signals, i.e., the tap coefficient signal 29a indicating the tap coefficient C(-2), the tap coefficient signal 29b indicating C(-1), the tap coefficient signal 29d indicating C(1), and the tap coefficient signal 29e indicating C(2).

In FIG. 3, the tap coefficient signals 29a, 29b, 29d and 29e are respectively provided to absolute value circuits 46a, 46b, 46d and 46e for absolute value. Further, an output from the absolute value circuit 46a is multiplied by (-2) in a coefficient circuit 47a for output to an adding circuit 48. Similarly, before being outputted to the adding circuit 48, an output from the absolute value circuit 46b is multiplied by (-1) in a coefficient circuit 47b, and an output from the absolute value circuit 46e is doubled in a coefficient circuit 47e. Herein, an output from the additional value circuit 46d is also provided to the adding circuit 48. In the adding circuit 48, these four incoming signals are added, and the sum is outputted as a signal 49. Through such processing, the signal 49 becomes a signal indicating 2|C(2)|+|C(1)|-|C(-1)|-2|C(-2)|.

Accordingly, the value of the signal 49 becomes positive when the absolute values of the tap coefficients C(1) and C(2) get larger than those of C(-1) and C(-2), and the signal value depends on how the absolute values are imbalanced. Contrarily, the value of the signal 49 becomes negative when the absolute values of the tap coefficients C(-1) and C(-2) get larger than those of C(1) and C(2), and the signal value depends on how the absolute values are imbalanced. In other words, the signal 49 shows how much the barycenter of the five tap coefficients in the adaptive equalizer 16 is moved off from the centric tap coefficient C(0).

The signal 49 is forwarded to a judgement circuit 50 from the adding circuit 48. The judgement circuit 50 outputs the tap barycenter signal 41 according to an assumptive positive given value R. In detail, the judgement circuit 50 outputs the tap barycenter signal 41 indicating a code "-1" when the value of the signal 49 is smaller than -R, the tap barycenter signal 41 indicating a code "+1" when the value of the signal 49 is larger than R, and the tap barycenter signal 41 indicating a code "0" when the value of the signal 49 is in the range between -R and R. More specifically, the tap barycenter signal 41 indicates "1" when the barycenter of the 5 tap coefficients in the adaptive equalizer 16 is displaced from the centric tap coefficient C(0) for a given value or more in the direction of C(-2) and C(-1). Similarly, the tap barycenter signal 41 indicates "+1" when the barycenter is displaced for the given value or more in the direction of C(2) and C(1), and indicates "0" when the displacement is within the given range. The tap barycenter signal 41 is provided to the phase shifter 42.

Figure 4:
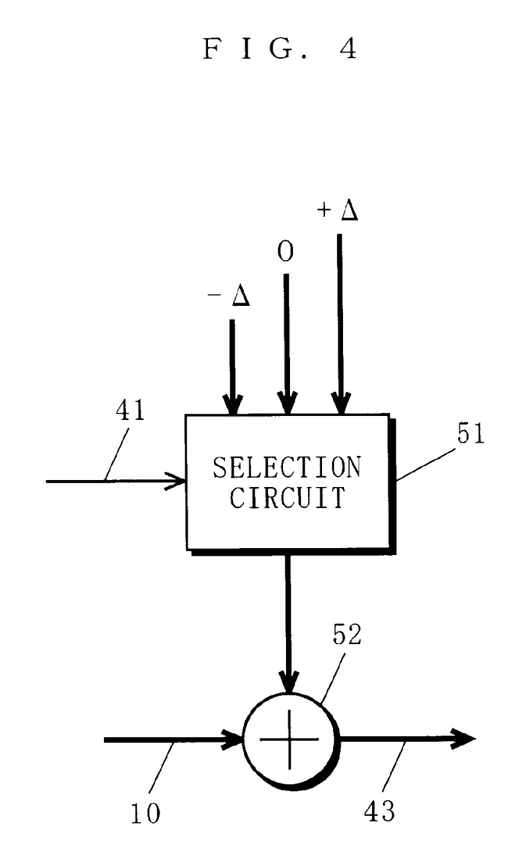
FIG. 4 is a block diagram showing the structure of a phase shifter in the signal processing apparatus of the first embodiment.

FIG. 4 is a block diagram showing the structure of the phase sifter 42 in the signal processing apparatus of the first embodiment. As shown in FIG. 4, the phase sifter 42 is provided with a selection circuit 51 and an adding circuit 52. The selection circuit 51 is controlled by the tap barycenter signal 41, and selects, for output, +Δ (where Δ is a very small positive value) when the tap barycenter signal 41 indicates "-1", selects 0 when the signal 41 indicates "0", and selects −Δ when the signal 41 indicates "+1". In the adding circuit 52, the output from the selection circuit 51 and the phase error signal 10 provided from the phase error detector 9 are added, and the sum is outputted as the shift phase error signal 43.

With such structure and operation, the signal processing apparatus of this embodiment may not cause competition in operation between the PLL for generating the clock signal 15 and the adaptive equalizer 16. The reason therefor is described next below.

Figure 5A:
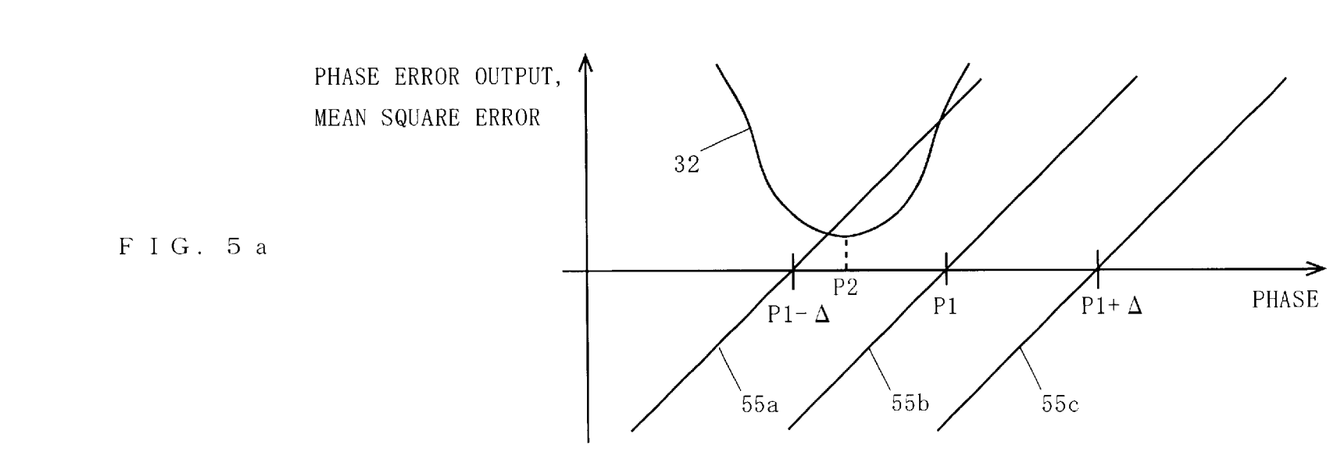
FIGS. 5a and 5b are characteristic graphs each illustrating how the signal processing apparatus of the first embodiment is operated.
Figure 5B:
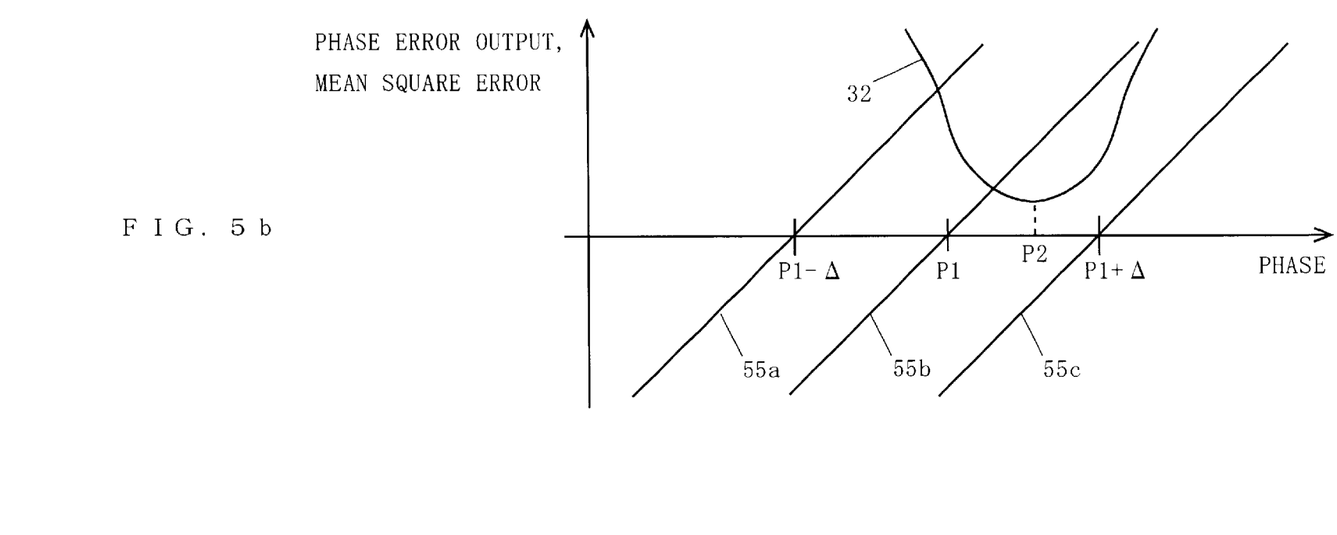

Linear lines 55a, 55b, and 55c in FIGS. 5a and 5b each indicates the relationship between the phase of the sample point of the equalized signal 6 and the phase error indicated by the shift phase error signal 43. The linear line 55a shows a case where the tap barycenter signal 41 indicates "−1", and in this case, the shift phase error signal 43 is 0 when the phase of the sample point of the equalized signal 6 is P1−Δ. The linear line 55b shows a case where the tap barycenter signal 41 indicates "0", and in this case, the shift phase error signal 43 is 0 when the phase of the sample point of the equalized signal 6 is P1. The linear line 55c shows a case where the tap barycenter signal 41 indicates "+1", and in this case, the shift phase error signal 43 is 0 when the phase of the sample point of the equalized signal 6 is P1+Δ.

In this manner, with the operation of the PLL structured by the feed back loop including all of the AD converter 17, the adaptive equalizer 16, the phase error detector 9, the phase shifter 42, the DA converter 11, the loop filter 12, and the variable frequency oscillation circuit 14, the phase of the equalized signal 6 is controlled to be P1−Δ when the tap barycenter signal 41 indicates "−1", to be P1 when the signal 41 indicates "0", and to be 1+Δ when the signal 41 indicates "+1".

The curve 32 shown in both FIGS. 5a and 5b indicates, with respect to the phase of the sample point of the equalized signal 6, the change in mean-square error of the signal amplitude of the equalized signal 6. In FIGS. 5a and 5b, P2 indicates the phase of the equalized signal 6 when the mean-square error being minimized. The mean-square error is an evaluation function of tap control in the adaptive equalizer 16, and each tap coefficient therein is so controlled as to minimize the mean-square error. The phases P1 and P2 coincide with each other under ideal conditions. In reality, however, the coincidence is not achieved but a slight difference is observed therebetween as is shown in FIGS. 5a and 5b. FIG. 5a exemplarily shows a case where P2<P1, and FIG. 5b a case where P2>P1.

Hereinafter, it is described an assumptive case where P2<P1 as in FIG. 5a, the displacement of the barycenter of the tap coefficients in the adaptive equalizer 16 from the tap coefficient C(0) is in the given range, and the tap barycenter signal 41 indicates "0". It is also assumed herein that the shift phase error signal 43 is indicated by the linear line 55b, and the phase of the sample point of the equalized signal 6 is on P1 due to the operation of the PLL.

In this case, in the adaptive equalizer 16, the tap coefficients are controlled in such a manner as to minimize the mean-square error of the equalized signal 6, that is, as to bring the phase of the sample point thereof closer to P2. In detail, in the adaptive equalizer 16 in FIG. 2, the coefficients C(−1) and C(−2) of the coefficient circuits 23 and 22 are more weighted (i.e., absolute value increased), while the coefficients C(1) and C(2) of the coefficient circuits 25 and 26 are less weighted. As a result, the phase of the sample point of the equalized signal 6 slightly moves from P1 to the direction of P2 in FIG. 5a.

Consequently, the value of the shift phase error signal 43 indicated by the linear line 55b is not 0 any more. Therefore, by the operation of the PLL, oscillation phase of the clock signal 15 is so controlled as to bring the phase of the sample point of the equalized signal 6 back to P1 again.

Thereafter, the adaptive equalizer 16 again so controls the tap coefficients as to bring the phase of the sample point of the equalized signal 6 closer to P2, and consequently the tap coefficients C(−1) and C(−2) are weighted still more, while the tap coefficients C(1) and C(2) are weighted still less. The phase of the sample point of the equalized signal 6 thus slightly moves from P1 to the direction of P2 in FIG. 5a again.

From then and onward, the PLL keeps controlling the oscillation phase of the clock signal 15 and the adaptive equalizer 16 keeps controlling the tap coefficients. As a result, the barycenter of the tap coefficients in the adaptive equalizer 16 moves from the coefficient C(0) of the coefficient circuit 24 to the coefficient C(−1) of the coefficient circuit 23 and the coefficient C(−2) of the coefficient circuit 22.

The tap barycenter detection circuit 40 then detects such movement of the barycenter of the tap coefficients, and accordingly the code indicated by the tap barycenter signal 41 is changed from "0" to "−1". Thereafter, due to the operation of the above-described phase shifter 42, the characteristic of the shift phase error signal 43 is switched from the linear line 55b to 55a in FIG. 5a. In response thereto, the PLL, which has controlled the phase of the equalized signal 6 to be P1, starts controlling the phase of the clock signal 15 so as to bring the phase of sample point of the equalized signal 6 to P1−Δ.

When the phase of the sample point of the equalized signal 6 became P1−Δ due to such operation of the PLL, the adaptive equalizer 16 so controls the tap coefficients that the phase of the sample point of the equalized signal 6 moves from P1−Δ to the direction of P2. If this is the case, contrarily, the coefficients of C(−1) and C(−2) are less weighted, and C(1) and C(2) are more weighted. As a result, the barycenter of the tap coefficients falls within the given range again. The tap barycenter circuit 40 detects such change, and then the code indicated by the tap barycenter signal 41 is again changed from "−1" to "0".

In response thereto, the phase of the sample point of the equalized signal 6 becomes the phase P1 again due to the operation of the PLL, and accordingly the barycenter of the tap coefficients in the adaptive equalizer 16 moves to the direction of C(−1) and C(−2) again. Resultantly, the code indicated by the tap barycenter signal 41 is changed again from "0" to "−1".

Due to the operation of the PLL again, the phase of the sample point of the equalized signal 6 becomes P1−Δ. The adaptive equalizer 16 this time so controls that the phase of the sample point of the equalized signal 6 gets closer to P2 from P1−Δ. Accordingly, tap coefficients C(−1) and C(−2) are less weighted and C(1) and C(2) are more weighted.

From then and onward, the same processing is repeated. That is, the barycenter of the tap coefficients in the adaptive equalizer 16 moves in the reverse direction every time the code indicated by the tap barycenter signal 41 is changed from/to "0" to/from "−1". Accordingly, the barycenter of the tap coefficients remains within the given range and never be beyond the range. Therefore, unlike the signal processing apparatus shown in FIG. 9, the barycenter of the tap coefficients in the adaptive equalizer 16 does not move to a large extent, whereby equalization can be fully carried out.

As is presumable from the above, in a case where P2>P1 as in FIG. 5b, the barycenter of the tap coefficients in the adaptive equalizer 16 moves in the reverse direction every time the code indicated by the tap barycenter signal 41 is changed from/to "0" to/from "+1". Accordingly, the barycenter of the tap coefficients remains within the given range and never be beyond the range. Therefore, unlike the signal processing apparatus shown in FIG. 9, the barycenter of the tap coefficients in the adaptive equalizer 16 does not move to a large extent, whereby equalization can be fully carried out.

The phase locked by the clock signal 15 is shifted between P1 and P1-Δ, or P1 and P1+Δ. However, as Δ being very small, data detection in the Viterbi decoder 7 may not be adversely affected.

As is obvious from the above, the value of Δ is arbitrarily set to be larger than a value between P1 and P2 under a condition that the value may not adversely affect the data detection in the Viterbi decoder 7. Note that, since the value between P1 and P2 depends on various factors relevant to a manner of detecting the mean-square error, phase error, and the like, it is preferable to determine the size of Δ according to the design specifications of the entire system.

As is described in the foregoing, according to the first embodiment, accurate phase lock can be realized, compared with the conventional signal processing apparatus in FIG. 8, by generating a clock signal after any phase error being detected from an adaptively-equalized signal. Further, the barycenter of the tap coefficients in the adaptive equalizer 16 remains within the given range, and is never beyond the range. Accordingly, equalization can always be fully carried out. Still further, analog equalization processing is not necessitated before sampling any more but only digital equalization processing will do, whereby improvement in equalization accuracy and a simplified LSI can be realized.

In this embodiment, the adaptive equalizer is provided with the transversal-type filter having 5 taps, but is not limited thereto and the number of taps provided in the filter may either be more or less than 5. Further, in this embodiment, the signal is supposedly reproduced from the magnetic recording medium, but may be reproduced from some other recording media, or may come from a transmission path. Still further, the signal is subjected to the partial response equalization in this embodiment, but the present invention may be adapted to arbitrary equalization characteristics.

Second Embodiment

By referring to FIGS. 6 and 7, it is described a signal processing apparatus according to a second embodiment of the present invention next below.

Figure 6:
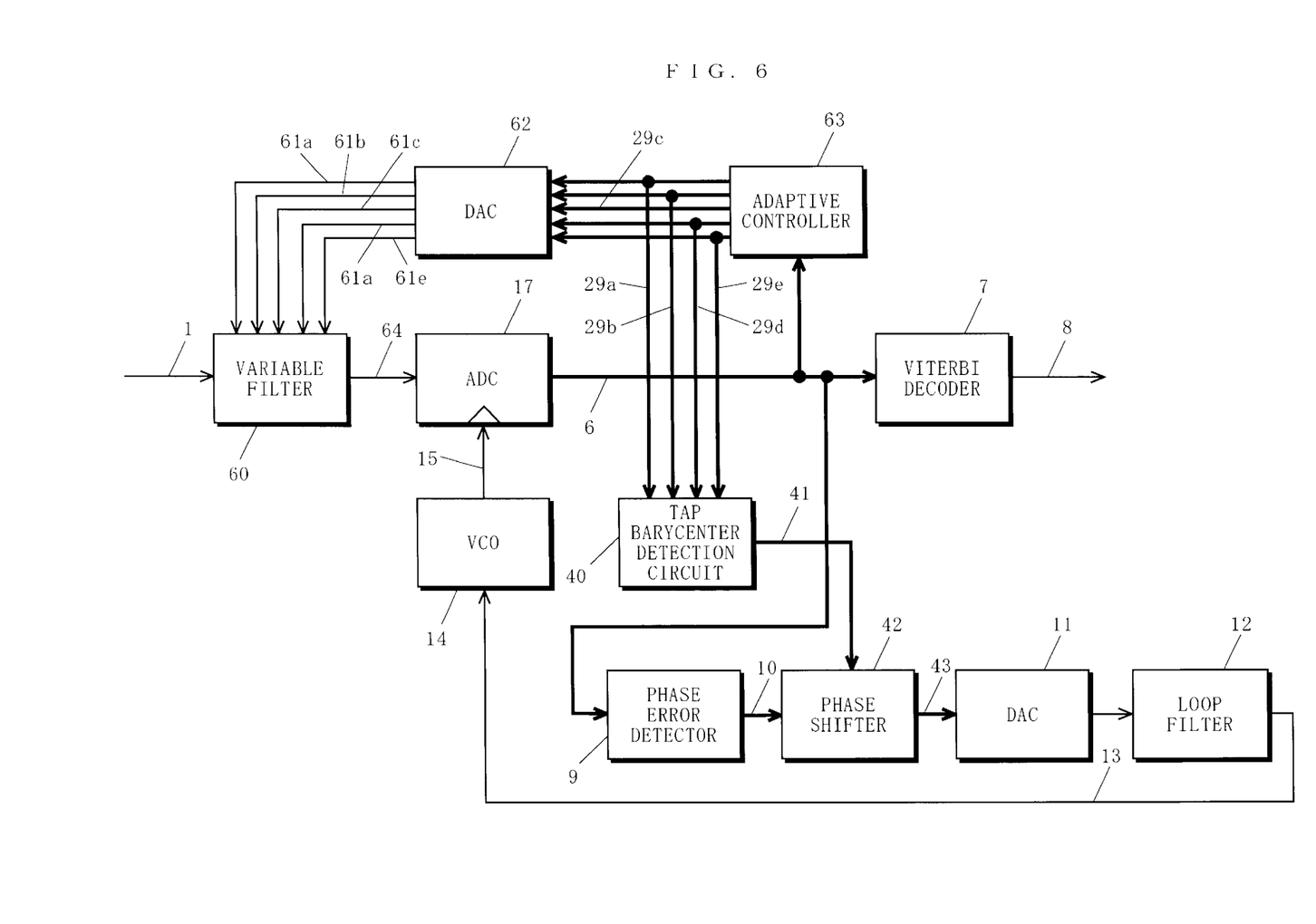
FIG. 6 is a block diagram showing the structure of a signal processing apparatus according to a second embodiment of the present invention.

FIG. 6 is a block diagram showing the structure of the signal processing apparatus of the second embodiment. As shown in FIG. 6, the signal processing apparatus is provided with a variable filter 60 as equalization means, the AD converter 17 as sampling means, an adaptive controller 63 as adaptive control means, a DA converter (DAC) 62, the phase error detector 9 as phase error detection means, the tap barycenter detector 40 as tap barycenter detection means, the phase shifter 42 as phase shift means, the DA converter (DAC) 11, the loop filter 12, and the variable frequency oscillation circuit (VCO) 14 as oscillation means. In FIG. 6, any constituent found in FIG. 1 is denoted by the same reference numeral.

The second embodiment is different from the first embodiment in a respect that the transversal-type filter part of an adaptive filter is subjected to analog processing before AD conversion. Herein, the tap coefficients in the transversal filter part are controlled according to an AD-converted signal.

In FIG. 6, the reproduced signal 1 reproduced from a magnetic recording medium is provided to the variable filter 60, and is subjected to equalization in such a manner that impulse response from recording to an analog equalized signal 64 being an output from the variable filter 60 becomes a given partial response characteristic.

Figure 7:
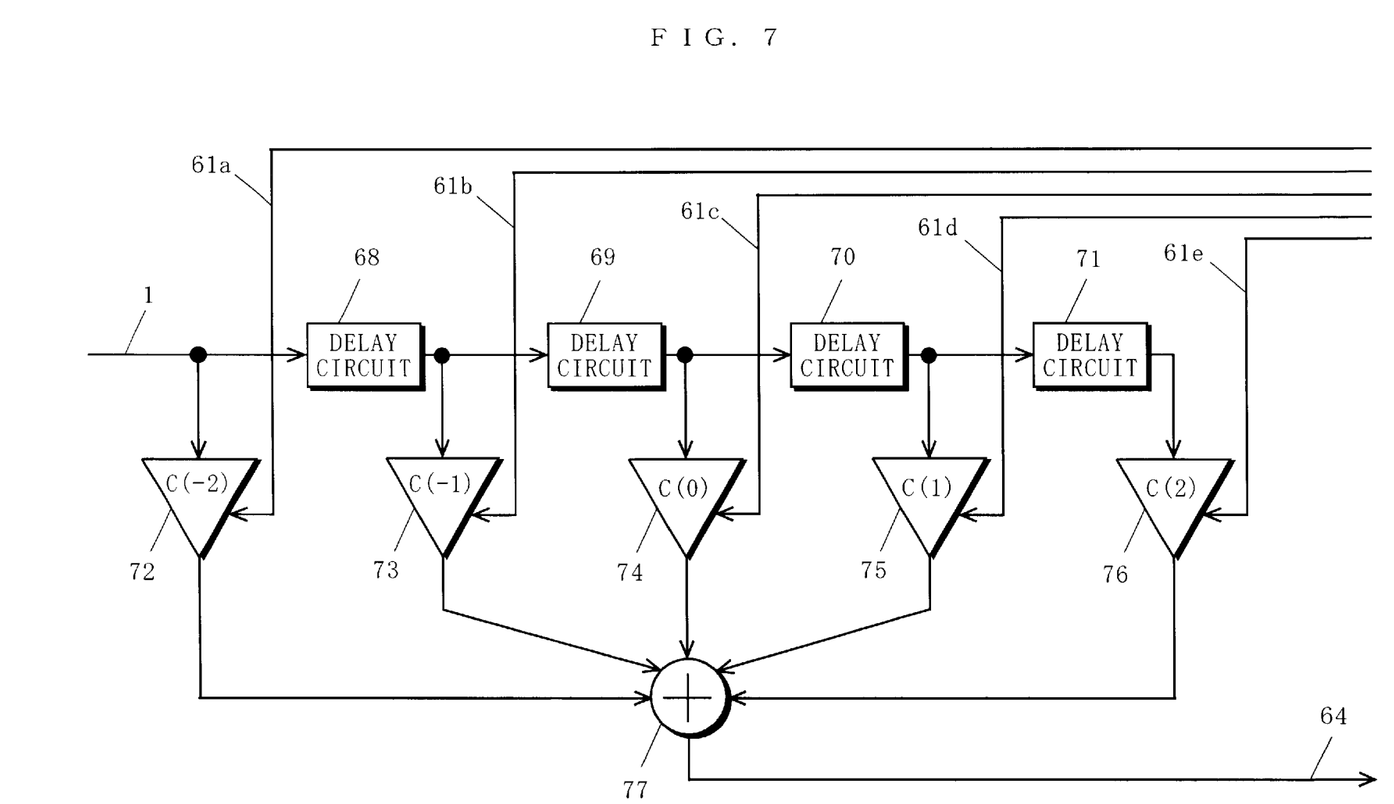
FIG. 7 is a block diagram showing the structure of a variable filter in the signal processing apparatus of the second embodiment.

FIG. 7 is a block diagram showing the structure of the variable filter 60 of this embodiment. As shown in FIG. 7, the variable filter 60 is structured by an analog processing transversal-type filter with 5 taps. The reproduced signal 1 is sequentially delayed by going through delay circuits 68 to 71, which each delays the signal on a data period basis. A coefficient circuit 72 multiplies the reproduced signal 1 by a coefficient C(−2). A coefficient circuit 73 multiplies an output from the delay circuit 68 by a coefficient C(−1). Similarly, for output, a coefficient circuit 74 multiplies an output from the delay circuit 69 by a coefficient C(0), a coefficient circuit 75 multiplies an output from the delay circuit 70 by a coefficient C(1), and a coefficient circuit 76 multiplies an output from the delay circuit 71 by a coefficient C(2). In an adding circuit 77, every output from the coefficient circuits 72 to 76 is added together for output as the analog equalized signal 64.

In FIG. 6, the analog equalized signal 64 is forwarded from the variable filter 60 to the AD converter 17. The AD converter 17 subjects the analog equalized signal 64 to sampling and digitalization with timing of the clock signal 15, and then outputs the equalized signal 6. The equalized signal 6 is provided to the Viterbi decoder 7. The Viterbi decoder 7 subjects the equalized signal 6 to most likelihood decoding according to the Viterbi algorithm, and detects the digital information recorded on the recording medium for output as the reproduction data 8.

The equalized signal 6 is also provided to the adaptive controller 63. In the adaptive controller. 63, the tap coefficients in the variable filter 60 are adaptively so controlled, according to the equalized signal 6, as to minimize the mean-square error of the signal amplitude of the equalized signal 6. For this purpose, the adaptive controller 63 outputs each of the tap coefficient signals 29a to 29e in the form of a digital signal. The tap coefficient signals 29a to 29e are fed to the 5-channel DA converter 62, and are converted into analog signals therein. Thereafter, these signals are fed back to the variable filter 60 as tap coefficient signals 61a to 61e. The tap coefficient signal 61a provides the coefficient circuit 72 in the variable filter 60 with the coefficient C(−2). Similarly, the tap coefficient signal 61b provides the coefficient circuit 73 with the coefficient C(−1), the tap coefficient signal 61c provides the coefficient circuit 74 with the coefficient C(0), the tap coefficient signal 61d provides the coefficient circuit 75 with the coefficient C(1), and the tap coefficient signal 61e provides the coefficient circuit 76 with the coefficient C(2). In this manner, the variable filter 60 adaptively subjects the reproduced signal 1, depending on a state of the signal, in such a manner as to minimize a deviation from an ideal signal value caused by time-varying change in characteristics of the recording medium or reproduction head, for example, and then outputs the analog equalized signal 64. Such adaptive control is well known as an LMS (Least Means Square) algorithm, and is not described in detail. Further, the tap coefficient signals other than the coefficient signal 29c indicating the centric tap coefficient C(0) are forwarded to the tap barycenter detection circuit 40.

The equalized signal 6 is provided also to the phase error detector 9. In the phase error detector 9, any phase error of the sample point of the equalized signal 6 is detected, and then the phase error signal 10 is outputted. The phase error signal 10 is provided to the phase shifter 42. The phase shifter 42 shifts the phase error indicated by the phase error signal 10 according to the tap barycenter signal 41 for output as the shift phase error signal 43. The shift phase error signal 43 outputted from the phase shifter 42 is converted into an analog signal in the DA converter 11, and the analog signal is subjected to smoothing in the loop filter 12 to be the oscillation frequency control signal 13. The oscillation frequency control signal 13 is provided to the variable frequency oscillation circuit 14. The variable frequency oscillation circuit 14 oscillates in a frequency according to a voltage of the oscillation frequency control signal 13, and outputs the clock signal 15. The clock signal 15 is fed back to the AD converter 17 as a clock for sampling therein. Since a feed back loop including all of the AD converter 17, the phase error detector 9, the phase shifter 42, the DA converter 11, the loop filter 12, and the variable frequency oscillation circuit 14 structures a PLL circuit, the clock signal 15 can be a clock phase-locked to the reproduced data.

In the second embodiment, the tap barycenter detector 40, the phase error detector 9, and the phase shifter 42 all operate in a similar manner to those in the first embodiment, and are not described again. With these constituents in the second embodiment, the barycenter of the tap coefficients in the variable filter 60 remains within a given range, and never be beyond the range. Accordingly, equalization can always be fully carried out.

As is known from the above, according to the second embodiment, similarly to the first embodiment, phase lock can be carried out more accurately than the conventional signal processing apparatus in FIG. 8 by generating a clock signal after any phase error being detected from an adaptively-equalized signal. Further, the barycenter of the tap coefficients in the variable filter 60 remains within the given range and never be beyond the range. Therefore, equalization can always be fully carried out. Still further, the feed back loop of the PLL circuit includes the AD converter 17, the phase error detector 9, the phase shifter 42, the DA converter 11, the loop filter 12 and the variable frequency oscillation circuit 14 but not the equalization filter. Therefore, response in the phase lock process can be made more quickly thanks to shorter delay time in the PLL loop.

In this embodiment, the variable filter is provided with the transversal-type filter having 5 taps, but is not limited thereto and the number of taps provided in the filter may either be more or less than 5. Further, in this embodiment, the signal is supposedly reproduced from the magnetic recording medium, but may be reproduced from some other recording media, or may come from a transmission path. Still further, the signal is subjected to the partial response equalization in this embodiment, but the present invention may be adapted to arbitrary equalization characteristics.

While the invention has been described in detail, the foregoing description is in all aspects illustrative and not irestrictive. It is understood that numerous other modifications and variations can be devised without departing from the scope of the invention.

What is claimed is:

1. A signal processing apparatus, comprising:
   sampling means for subjecting an incoming signal to sampling with a given clock signal;
   equalization means for subjecting the signal sampled by said sampling means to product-sum operation according to a plurality of tap coefficients;
   adaptive control means for setting, on the basis of an output signal from said equalization means, a plurality of tap coefficients of said equalization means according to a given algorithm;
   phase error detection means for detecting a phase error from the output signal from said equalization means;
   tap barycenter detection means for detecting, according to the plurality of tap coefficients set by said adaptive control means, a barycenter of the tap coefficients;
   phase shift means for correcting an output from said phase error detection means according to an output from said tap barycenter detection means; and
   oscillation means for oscillating in a frequency based on an output signal from said phase shift means, and generating said given clock signal for output to said sampling means.

2. The signal processing apparatus as claimed in claim 1, wherein said tap barycenter detection means includes product-sum operation means for multiplying, by a given value, every absolute value of the tap coefficients set by said adaptive control means, and adding the values.

3. The signal processing apparatus as claimed in claim 1, wherein said phase shift means selects any one of correction values predetermined according to the output from said tap barycenter detection means, and correcting the output from said phase error detection means according to the selected correction value.

4. A signal processing apparatus, comprising:
   equalization means for subjecting an incoming signal to product-sum operation according to a plurality of tap coefficients;
   sampling means for subjecting an output signal from said equalization means to sampling with a given clock signal;
   adaptive control means for setting, on the basis of an output signal from said sampling means, a plurality of tap coefficients of said equalization means according to a given algorithm;
   phase error detection means for detecting a phase error from the output signal from said sampling means;
   tap barycenter detection means for detecting, according to the plurality of tap coefficients set by said adaptive control means, a barycenter of the tap coefficients;
   phase shift means for correcting an output from said phase error detection mean according to an output from said tap barycenter detection means; and
   oscillation means for oscillating in a frequency according to an output signal from said phase shift means, and generating said given clock signal for output to said sampling means.

5. The signal processing apparatus as claimed in claim 4, wherein said tap barycenter detection means includes operation means for multiplying, by a given value, every absolute value of the tap coefficients set by said adaptive control means, and adding the values.

6. The signal processing apparatus as claimed in claim 4, wherein said phase shift means selects any one of correction values predetermined according to the output from said tap barycenter detection means, and correcting the output from said phase error detection means according to the selected correction value.

* * * * *